(12) United States Patent
Pai et al.

(10) Patent No.: US 8,305,774 B2
(45) Date of Patent: Nov. 6, 2012

(54) ENCLOSURE OF ELECTRONIC DEVICE

(75) Inventors: Yu-Chang Pai, Taipei Hsien (TW);
Po-Chuan Hsieh, Taipei Hsien (TW);
Chien-Hung Liu, Taipei Hsien (TW);
Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 184 days.

(21) Appl. No.: 12/855,903

(22) Filed: Aug. 13, 2010

(65) Prior Publication Data
US 2011/0299263 A1    Dec. 8, 2011

(30) Foreign Application Priority Data
Jun. 7, 2010    (TW) .............................. 99118297 A

(51) Int. Cl.
*H05K 9/00* (2006.01)

(52) U.S. Cl. .................... 361/818; 361/816; 174/383

(58) Field of Classification Search ................. 361/816, 361/818, 800, 799, 679.46, 728–730, 752, 361/796; 174/51, 35 R, 383; 454/184
See application file for complete search history.

(56) References Cited

U.S. PATENT DOCUMENTS

| | | | |
|---|---|---|---|
| 2,800,016 A * | 7/1957 | Sturgeon | 73/861.12 |
| 6,784,368 B2 * | 8/2004 | Imai et al. | 174/74 R |
| 7,223,106 B2 * | 5/2007 | Nakajima et al. | 439/74 |
| 7,345,247 B2 * | 3/2008 | Ireland | 174/267 |
| 2009/0084705 A1 * | 4/2009 | Justiss | 206/724 |
| 2011/0127680 A1 * | 6/2011 | Masuda et al. | 257/779 |

* cited by examiner

*Primary Examiner* — Hung S Bui
(74) *Attorney, Agent, or Firm* — Altis Law Group, Inc.

(57) ABSTRACT

An enclosure includes a plate. The plate defines a number of through holes. A hollow shield extends from the edges bounding each through hole. A top side of the shield opposite to the plate is smaller than a bottom side of the shield which is connected to the edges of the through hole. The enclosure can better shield electromagnetic interference (EMI) from the electronic device.

5 Claims, 3 Drawing Sheets

ENCLOSURE OF ELECTRONIC DEVICE

CROSS-REFERENCE TO RELATED APPLICATIONS

Relevant subject matter is disclosed in the co-pending U.S. patent applications (application Ser. Nos. 12/841,125, 12/849,939, 12/859,283, 12/860,941, 12/868,687, 12/869,709) having the same title, which are assigned to the same assignee as named herein.

BACKGROUND

1. Technical Field

The present disclosure relates to an enclosure of an electronic device.

2. Description of Related Art

For the enclosure of a typical electronic device, electromagnetic interference (EMI) is a common problem during operation. Commonly, through holes are defined in the enclosure for aiding in heat dissipation, and though sizes and placement of the holes are chosen and arranged to help avoid EMI, problems from EMI still occur.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
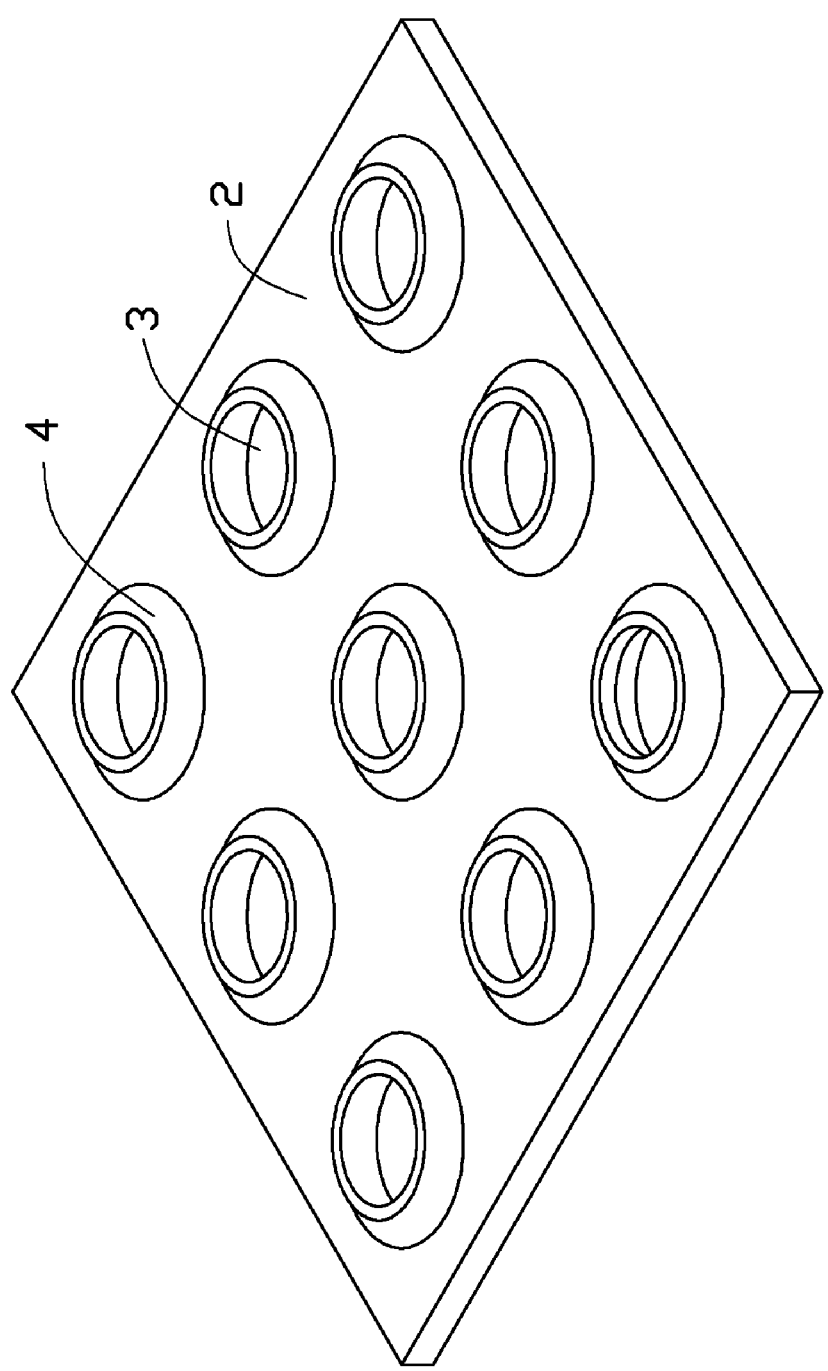
FIG. 1 is an isometric view of a plate in an exemplary embodiment of an enclosure.
Figure 2:
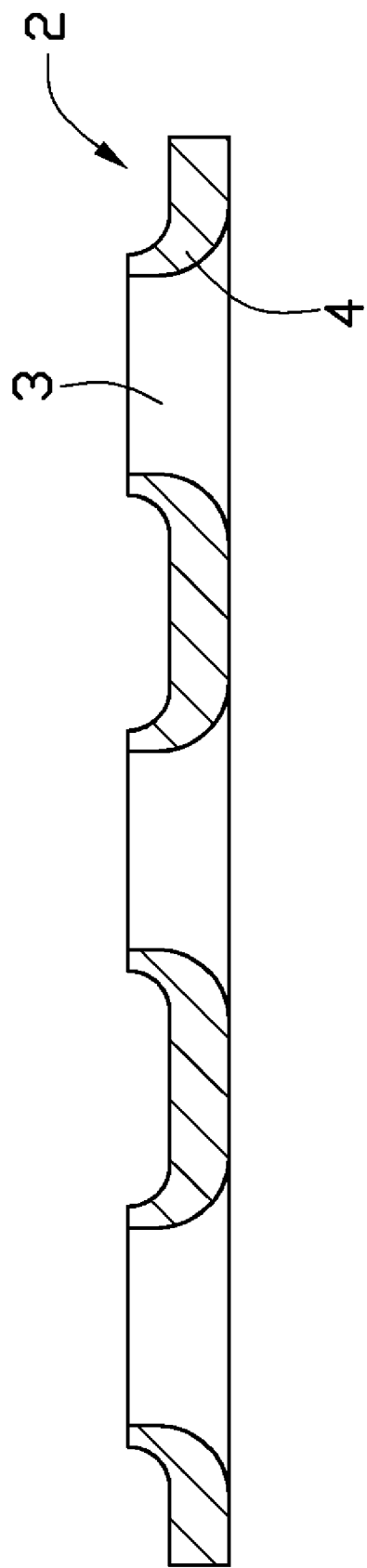
FIG. 2 is a sectional view of the plate of FIG. 1.

Referring to FIGS. 1 and 2, an exemplary embodiment of an enclosure of an electronic device includes a ventilation plate 2. The ventilation plate 2 can be arranged on a front side or a back side of the enclosure.

The ventilation plate 2 defines a plurality of through holes 3, with a plurality of shields 4 extending out from an edge bounding the through holes 3 respectively. Each shield 4 is a hollow truncated cone. A bottom side of the shield 4 matches the through hole 3 in diameter. A top side of the shield 4 opposite to the ventilation plate 2 defines an opening and is smaller than the bottom side. A sidewall of the shield 4 between the top and bottom sides is depressed towards the through hole 3, to form a smooth curved surface. A diameter of each of the through holes 3 is greater than a diameter of each of the openings. A smoothly curved surface is formed between each of the through holes 3 and the corresponding opening to facilitate heat ventilation. Heat inside the enclosure can be vented to the outside through the through holes 3 and the openings of the shields 4.

Figure 3:
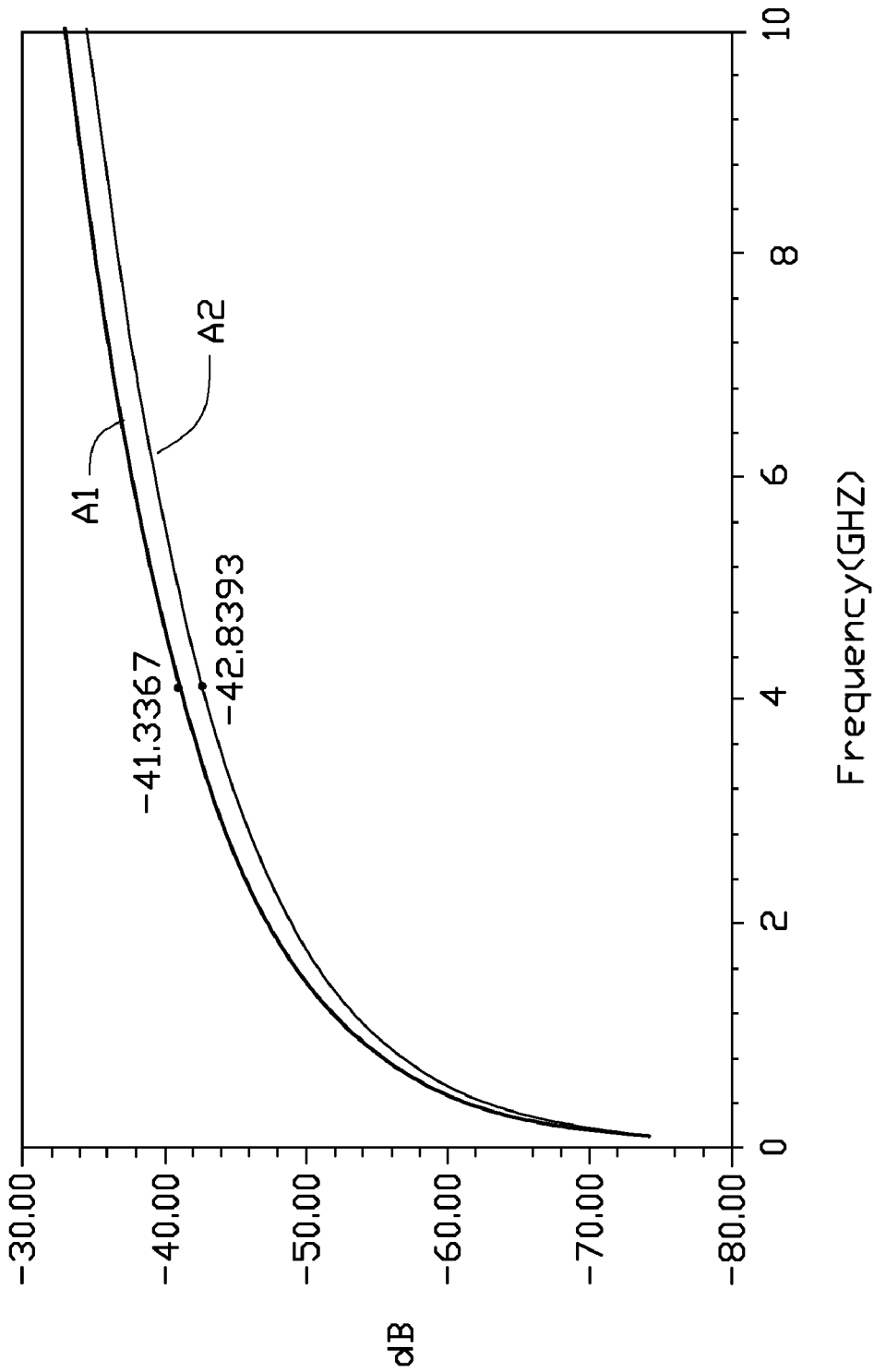
FIG. 3 is a graph showing EMI shielding effectiveness of a conventional enclosure and an enclosure using the plate in FIG. 1.

Referring to FIG. 3, a curve A1 represents EMI shielding effectiveness of a conventional enclosure. A curve A2 represents EMI shielding effectiveness of the enclosure using the plate 2 of FIG. 1. FIG. 3 clearly indicates that the EMI shielding effectiveness of the enclosure with the plate 2 is better than the EMI shielding effectiveness of the conventional enclosure.

In other embodiments, the size of the shield 4 can be changed according to need. When the shields 4 are configured with a different size, the EMI shielding effectiveness of the enclosure may be different. In addition, shape of the through holes 3 need not be round as shown in the figures.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An enclosure of an electronic device for shielding electromagnetic interference (EMI), comprising a ventilation plate, wherein the ventilation plate defines a plurality of through holes, a hollow shield extends out from an edge bounding each through hole, a top side of the shield opposite to the ventilation plate defines an opening and is smaller than a bottom side of the shield which is connected to the edges of the through hole, and heat generated by the electronic device in the enclosure is vented out of the enclosure through the through holes and the openings of the shields.

2. The enclosure of claim 1, wherein each through hole is round.

3. The enclosure of claim 2, wherein each shield is a hollow truncated cone, a sidewall of the shield is depressed towards the through hole to form a smoothly curved surface.

4. The enclosure of claim 3, wherein a diameter of each of the through holes is greater than a diameter of each of the openings.

5. The enclosure of claim 4, wherein a smoothly curved surface is formed between each of the through holes and the corresponding opening to facilitate heat ventilation.

* * * * *